US012537303B2

(12) United States Patent
Zhu et al.

(10) Patent No.: US 12,537,303 B2
(45) Date of Patent: Jan. 27, 2026

(54) LOW BAND DIPOLE WITH EXTENDED BANDWIDTH AND IMPROVED MID BAND CLOAKING

(71) Applicant: John Mezzalingua Associates, LLC, Liverpool, NY (US)

(72) Inventors: Jiaqiang Zhu, Baldwinsville, NY (US); Niranjan Sundararajan, Clay, NY (US); Wengang Chen, Jamesville, NY (US)

(73) Assignee: John Mezzalingua Associates, LLC, Liverpool, NY (US)

(*) Notice: Subject to any disclaimer, the term of this patent is extended or adjusted under 35 U.S.C. 154(b) by 90 days.

(21) Appl. No.: 18/143,857

(22) Filed: May 5, 2023

(65) Prior Publication Data

US 2023/0361472 A1 Nov. 9, 2023

Related U.S. Application Data

(60) Provisional application No. 63/339,086, filed on May 6, 2022.

(51) Int. Cl.

| | |
|---|---|
| ***H01Q 5/50*** | (2015.01) |
| ***H01Q 9/16*** | (2006.01) |
| ***H01Q 21/08*** | (2006.01) |
| ***H03H 7/42*** | (2006.01) |

(52) U.S. Cl.

CPC ................. *H01Q 5/50* (2015.01); *H01Q 9/16* (2013.01); *H01Q 21/08* (2013.01); *H03H 7/42* (2013.01)

(58) Field of Classification Search

CPC H01Q 5/50; H01Q 9/16; H01Q 21/08; H01Q 1/521; H01Q 5/42; H01Q 21/26; H03H 7/42

See application file for complete search history.

(56) References Cited

U.S. PATENT DOCUMENTS

| | | | |
|---|---|---|---|
| 10,958,316 | B2 | 3/2021 | Bisiules et al. |
| 11,205,852 | B2 | 12/2021 | Wu et al. |
| 11,515,622 | B2 | 11/2022 | Hou et al. |
| 11,611,143 | B2 | 3/2023 | Hou et al. |
| 11,621,755 | B2 | 4/2023 | Wu et al. |
| 11,664,600 | B2 | 5/2023 | Wu et al. |
| 2020/0373668 | A1 | 11/2020 | Wu et al. |
| 2021/0305718 | A1 | 9/2021 | Li et al. |
| 2021/0359414 | A1 | 11/2021 | Sundararajan et al. |

(Continued)

FOREIGN PATENT DOCUMENTS

WO 2020-191605 A1 10/2020

OTHER PUBLICATIONS

International Search Report and the Written Opinion of Application No. PCT/US2023/021172, Dated Aug. 30, 2023.

*Primary Examiner* — Dieu Hien T Duong

(74) *Attorney, Agent, or Firm* — Meunier Carlin & Curfman LLC

(57) ABSTRACT

A low band dipole for a dense multiband antenna array has a plurality of dipole arms. The dipole arms have a coupling plate disposed on a first side of a PCB and a conductive trace pattern disposed on a second side of the PCB. The conductive trace pattern has a plurality of resonator block structures that are coupled together by a phase shifting trace along a first edge of the conductive trace pattern and a bandwidth compensating disposed along a second edge of the conductive trace pattern.

10 Claims, 6 Drawing Sheets

(56) References Cited

U.S. PATENT DOCUMENTS

| | | | |
|---|---|---|---|
| 2021/0391655 | A1 | 12/2021 | Brobston et al. |
| 2022/0052442 | A1 | 2/2022 | Varnoosfaderani et al. |
| 2023/0082093 | A1 | 3/2023 | Pollayi et al. |
| 2023/0170957 | A1 | 6/2023 | Zimmerman et al. |
| 2023/0361472 | A1* | 11/2023 | Zhu ........................ H01Q 21/26 |

* cited by examiner

LOW BAND DIPOLE WITH EXTENDED BANDWIDTH AND IMPROVED MID BAND CLOAKING

CROSS REFERENCE TO RELATED APPLICATIONS

This application is a non-provisional of and claim priority benefit of U.S. Provisional Patent Application Ser. No. 63/339,086, filed May 6, 2022, which application is hereby incorporated by this reference in its entirety as if fully set forth herein.

BACKGROUND OF THE INVENTION

Field of the Invention

The present invention relates to wireless communications, and more particularly, low band (LB) dipoles for use in multiband antennas.

Related Art

The proliferation of numerous new frequency bands in cellular communications has increased demand for antennas that operate in multiple bands. There is also increasing pressure to keep antenna footprints small so that the antennas' wind load doesn't worsen and so that they take up a minimal size in dense urban settings. These opposing forces place considerable pressure on antenna designers, requiring them to place antenna dipoles of different frequency bands in closer proximity to each other, exacerbating inter-band interference and re-radiation, which degrades antenna performance.

LB dipoles, being the largest of the dipoles within a multiband antenna, suffer the most from inter-band interference because they are the largest, and densifying multiband antenna dipole layouts require that the arms of LB dipoles extend over and overlap with mid band (MB) and C-Band dipoles. Conventional cloaking techniques exist to mitigate MB coupling and re-radiation in the LB dipoles, but there are limits to the effectiveness of conventional techniques. For example, a conventional LB dipole may be designed to operate in a frequency range of 617-894 MHz. However, there is demand for LB dipoles to operate in lower frequencies, extending the LB frequency range such that the desired LB range is 617-894 MHz, wherein conventional cloaking techniques do not prevent interference at such a broad frequency range that extends so far into low frequencies.

Accordingly, what is needed is a LB dipole design that is effectively transparent in the mid band from 617-894 MHz, and that may be located in close proximity to MB dipoles to meet antenna densification demands.

SUMMARY OF THE DISCLOSURE

An aspect of the present disclosure involves a low band dipole for a multiband antenna. The low band dipole comprises a balun stem; and a plurality of dipole arms mechanically coupled to the balun stem, wherein each of the dipole arms has a PCB (Printed Circuit Board) substrate, a coupling plate disposed on a first side of the PCB substrate, and a conductive trace pattern disposed on a second side of the PCB substrate, wherein the conductive trace pattern has a plurality of resonator block structures, each of adjacent resonator block structure coupled by a phase shifting trace and a bandwidth compensating trace.

Another aspect of the present disclosure involves a low band dipole for a multiband antenna. The low band dipole comprises a balun stem; and a plurality of dipole arms mechanically coupled to the dipole stem, wherein each of the dipole arms comprises a plurality of resonator means; a means for phase shifting disposed between adjacent resonator means; and a means for bandwidth compensation disposed between the adjacent resonator means.

BRIEF DESCRIPTION OF THE DRAWINGS

The accompanying drawings, which are incorporated in and constitute a part of this specification, illustrate (one) several embodiment(s) of the invention and together with the description, serve to explain the principles of the invention.

DESCRIPTION OF EXEMPLARY EMBODIMENTS

Figure 1:
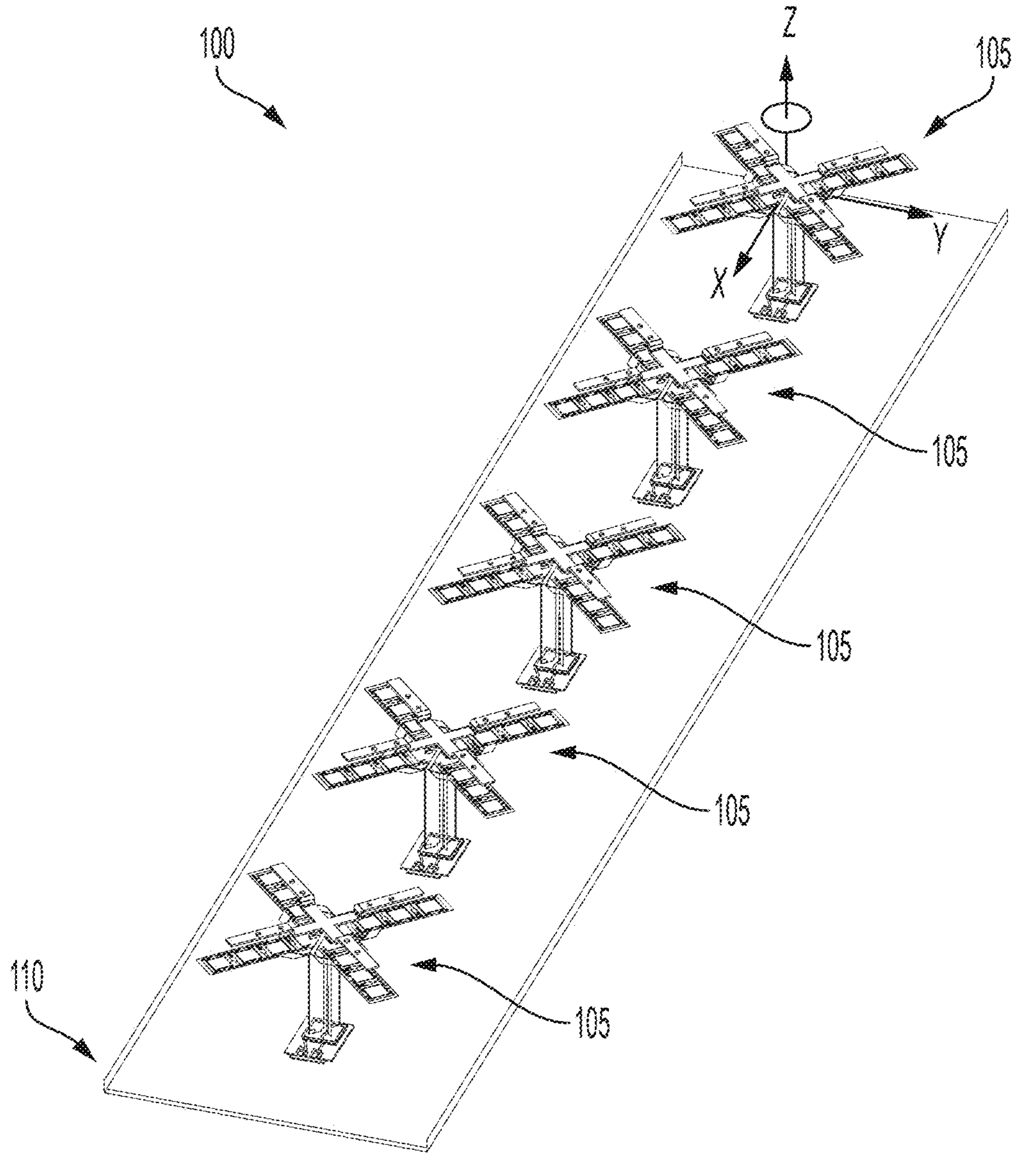
FIG. 1 illustrates an exemplary array of LB dipoles that would be integrated into a multiband antenna.

FIG. 1 illustrates an exemplary array 100 of LB dipoles 105 that would be integrated into a multiband antenna. Array 100 has five exemplary LB dipoles 105 arranged in a vertical column and mechanically coupled to a reflector plate 110. Not shown are the MB dipoles that would be deployed in an array in close proximity with the LB dipoles 105 of array 100.

Figure 2:
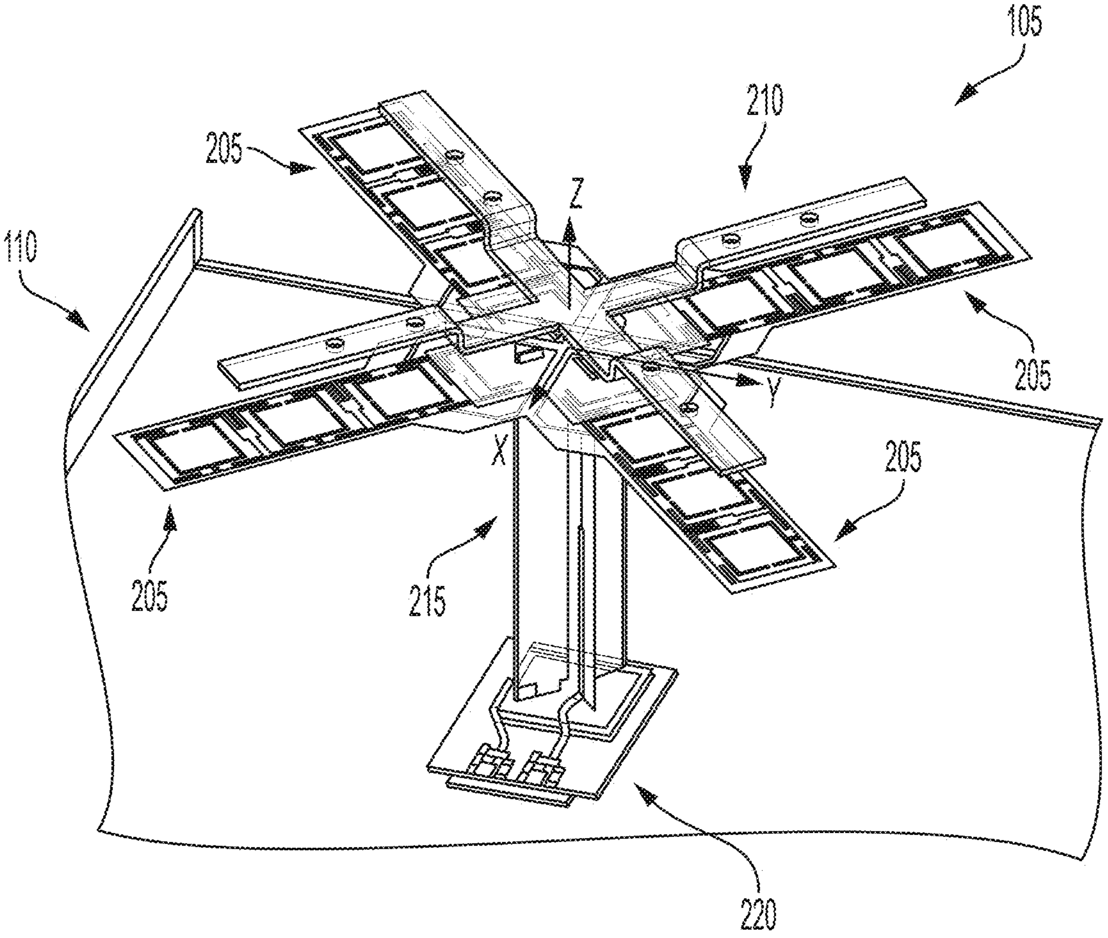
FIG. 2 illustrates an exemplary LB dipole according to the disclosure.

FIG. 2 illustrates an exemplary LB dipole 105 according to the disclosure. LB dipole 105 has four LB dipole arms 205 that are disposed in a cross pattern. LB dipole arms 205 are mechanically and electrically coupled to a balun stem 215, which is in turn coupled to a feed plate 220 that is mechanically coupled to reflector plate 110. Also illustrated is a director plate 210, which is disposed above the four LB dipole arms 205 and may be mechanically mounted above the four dipole arms using a non-conductive clip or base structure (not shown). The function of director plate is to broaden the bandwidth of the four LB dipole arms 205.

Figure 3:
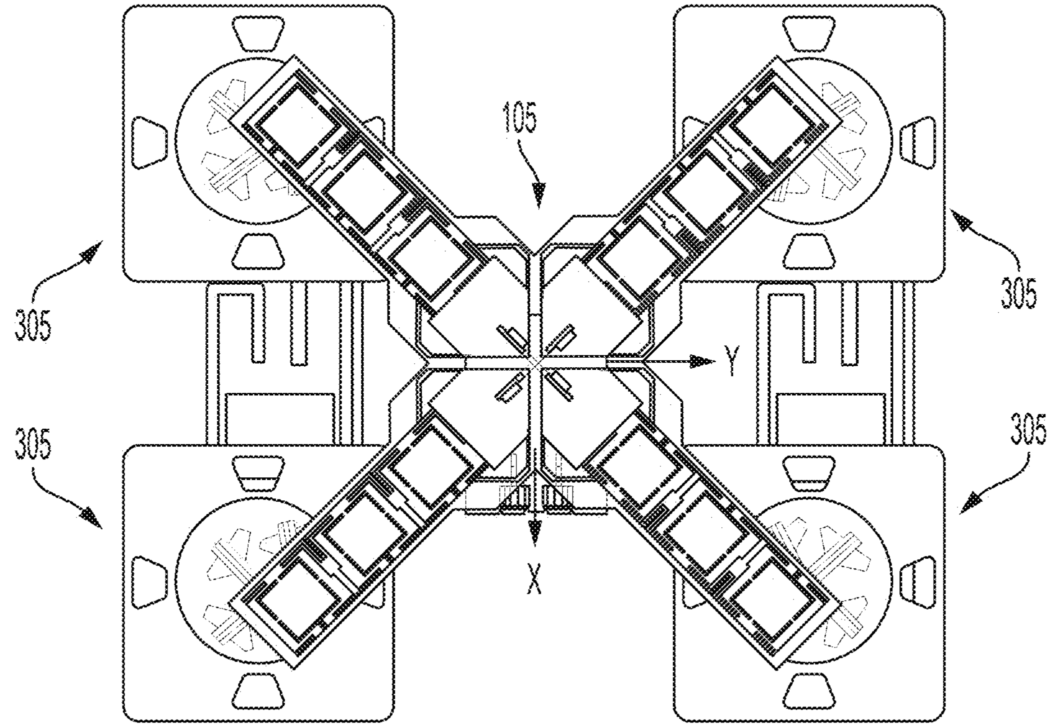
FIG. 3 illustrates the exemplary dipole of FIG. 2, deployed in expected close proximity to a subarray of MB dipoles.

FIG. 3 illustrates exemplary LB dipole 105, with director plate 210 removed for the purposes of illustration, mounted in close proximity to a subarray of MB dipoles 305. As illustrated, dipole arms 205 of LB dipole 105 extend over and thus shadow MB dipoles 305. Given the diagonal orientation of LB dipole arms 205, it is generally not feasible to place LB dipole 105 in close proximity with a plurality of MB dipoles 305 without such shadowing. Accordingly, it is important for LB dipole 105 to be designed such that it's dipole arms 205 are effectively transparent to the MB energy emitted by MB dipoles 305.

Figure 4:
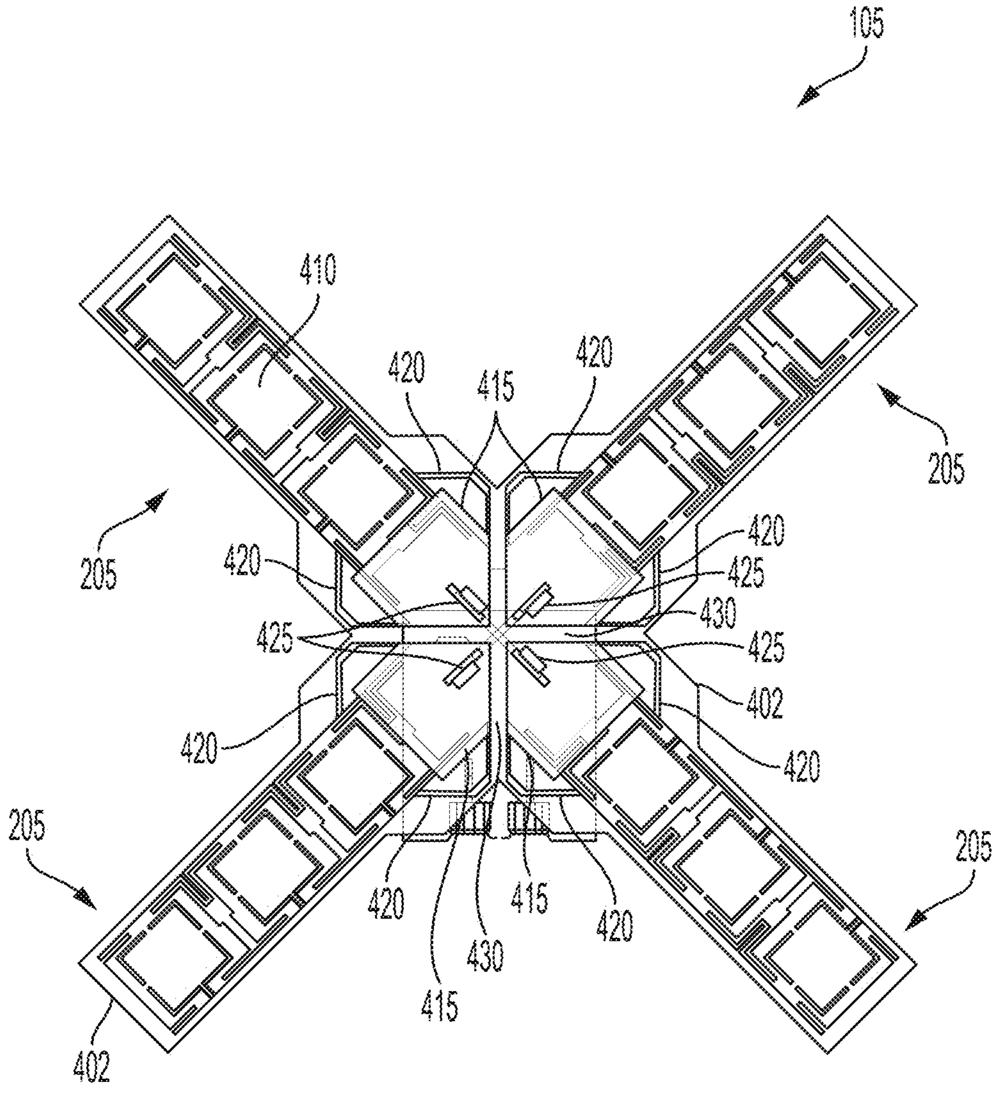
FIG. 4 illustrates exemplary LB dipole of FIGS. 1 and 2, with the director removed.

FIG. 4 illustrates exemplary LB dipole 105, with the director plate 210 removed for purposes of illustration. LB dipole 105 has four dipole arms 205, each of which as a conductive trace pattern 410 disposed on the underside of a PCB (Printed Circuit Board) 402 (in outline). Conductive trace pattern 410 may be formed of a single sheet of 1.4 mil thick copper, and PCB 402 may be formed of a 30 mil thick FR4 material, for example. Disposed on an upper surface of PCB 402 are four coupling plates 415, one per dipole arm 205. The four coupling plates 415 are each directly coupled to feeder traces on balun stem 215 (not shown in FIG. 4) via a corresponding solder joint 425. Each coupling plate 415 is capacitively coupled to its corresponding dipole arm 205 across the dielectric of PCB 402. Having coupling plates 415 capacitively coupled to corresponding dipole arms 205 improves the bandwidth performance of LB dipole 105. The impedance of LB dipole 105 may be tuned by adjusting the dimensions of coupling plates 415 to adjust the width of gap 430 between coupling plates 415. Each dipole arm 205 has a high gain wing trace 420 disposed on either side. The high gain wing traces 420 increase the volume of their corresponding dipole arms 205 and thus increase the gain of LB dipole 105.

Figure 5A:
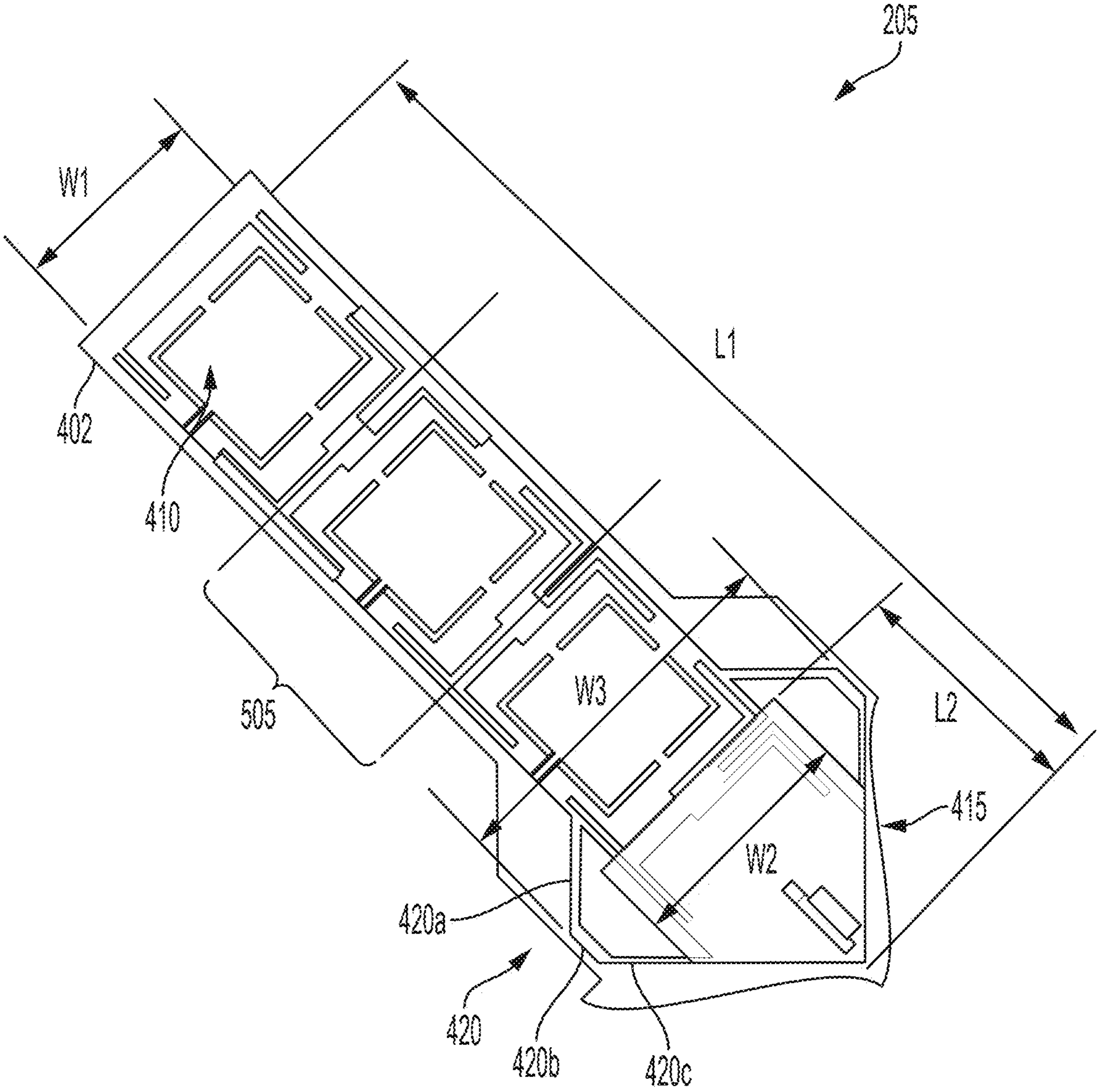
FIG. 5A illustrates an exemplary dipole arm of the LB dipole according to the disclosure.

FIG. 5A illustrates one of the exemplary dipole arms 205 of LB dipole 105 according to the disclosure. Dipole arm 205 is formed of a conductive trace pattern 410 that has three repeating resonator block structures 505 disposed on PCB 402 (the center resonator block structure 505 is indicated in the figure). As shown in FIG. 5A, exemplary conductive trace pattern 410 may have a width W1 of 20.93 mm, and a length L1 of 96.16 mm; and coupling plate 415 may have a width W2 of 24.39 mm, and a length L2 of 24.94 mm. Further, high gain wing trace 420 has a first segment 420 that may have at width of 0.7 mm, a second parallel segment 420*b* that may have a width of 1.175 mm, a third segment that may have a width of 0.475 mm. The combined width W3 of the high gain wing traces 420 and conductive trace pattern 410 may equal 37.6 mm. It will be understood that these dimensions are exemplary and that variations are possible and within the scope of the disclosure.

Figure 5B:
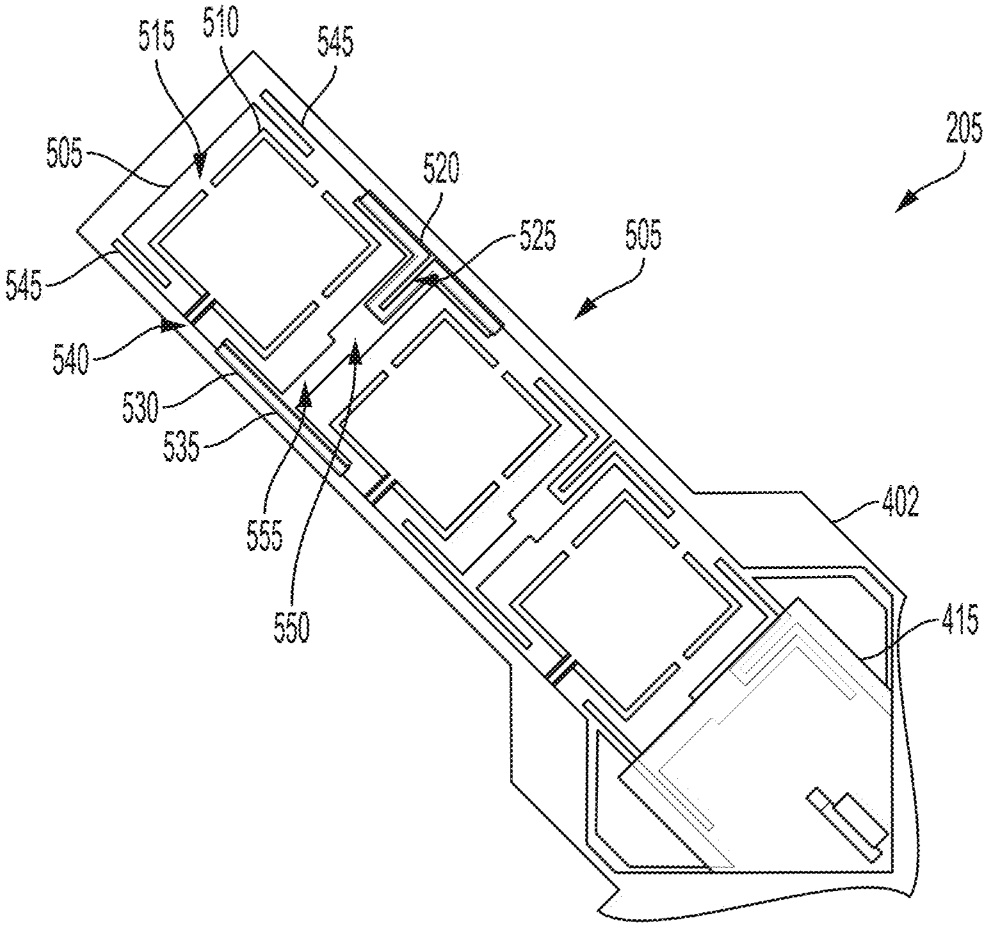
FIG. 5B illustrates the exemplary dipole arm of the LB dipole of FIG. 5A, making reference to further details.

FIG. 5B illustrates provides the same view of dipole arm 205, but with further detail of one of the resonator block structures 505. Resonator block structure 505 has a rectangular pattern of gaps 510 that are interrupted by bridges 515 that define an inner portion of the block structure 505 and an outer portion. Inner portion of resonator block structure 505 may be square, with dimensions of 14.39 mm per side. In an exemplary embodiment, gaps 510 may have a width of 0.76 mm, for example. Resonator block structure 505 is coupled to its neighbor resonator block structure 505 by two traces: phase shifting trace 520 and bandwidth compensating trace 530 (both highlighted in FIG. 5B). Phase shifting trace 520 and bandwidth compensating trace 530 may be disposed on opposite edges of conductive trace pattern 410. Phase shifting trace 520 has a meander portion 525, which increases the path length of phase shifting trace 520 to achieve a 180 degree phase shift in an RF (Radio Frequency) current flowing in conductive trace pattern 410 between adjacent resonator block structures 505. Phase shifting trace 520 may have a path length of 31.2 mm, a trace width of 0.781 mm, and a separation of 0.698 mm Phase shifting trace 520 may be disposed in a first gap 535 between adjacent resonator block structures 505, which is wider than a second gap 555 between adjacent resonator block structures 505. First gap 550 may have a width of 3.72 mm, and second gap 555 may have a width of 1.8 mm. It will be understood that the dimensions provided herein are exemplary and that variations are possible and within the scope of the disclosure.

Bandwidth compensating trace 530 has a thin line step 535, which provides a high impedance between resonator block structure 505 and its neighboring resonator block structure 505 to help make dipole arm 250 transparent to MB frequencies and prevents MB resonance. Bandwidth compensating trace 530 may have a path length of 17.3 mm and a width of 0.781 mm; and thin line step 535 may have a width of 0.381 mm. It will be understood that these dimensions are exemplary and that variations are possible and within the scope of the disclosure.

Resonator block structure 505 further has a decoupling structure 540, which may be formed by a gap in an outer portion of resonator block structure 505 and a tab protrusion from the inner part of resonator block structure. Decoupling structure 540 helps prevent MB resonance from occurring in dipole arm 205.

Resonator block structure 505 further has a pair of decoupling slots 545, which simply mirror the geometry of the gap between bandwidth compensating trace 530 and the adjacent outer portion of resonator block structure 505.

The disclosed exemplary LB dipole 105 has an advantage in that it prevents MB radiation from inducing a current within the in conductive trace pattern 410, which might otherwise re-radiate and interfere with the performance of nearby MB dipoles 305. Further, the disclosed structure for the LB dipole arms provides for high performance in the lower ranges of the low band: extending down to 617 MHZ, while substantially preventing MB resonance.

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. A low band dipole for a multiband antenna, comprising:
- a balun stem; and
- a plurality of dipole arms mechanically coupled to the balun stem,
- wherein each of the dipole arms has a PCB (Printed Circuit Board) substrate, a coupling plate disposed on a first side of the PCB substrate, and a conductive trace pattern disposed on a second side of the PCB substrate, wherein the conductive trace pattern has a plurality of resonator block structures, and wherein each adjacent resonator block structure is coupled by a phase shifting trace and a bandwidth compensating trace, and wherein the coupling plate is directly coupled a balun trace disposed on the balun stem.

2. The low band dipole of claim 1, wherein the phase shifting trace is disposed along a first edge of the conductive trace pattern and the bandwidth compensation trace is disposed along a second edge of the conductive trace pattern.

3. The low band dipole of claim 1, wherein the phase shifting trace comprises a meander portion.

4. The low band dipole of claim 3, wherein the phase shifting trace further comprises a path length is configured to impart a 180 degree phase shift in a mid band RF (radio frequency) oscillation induced in the conductive trace pattern.

5. The low band dipole of claim 1, wherein the bandwidth compensating trace comprises a thin line step that is disposed in the bandwidth compensating trace between two adjacent resonator block structures, the thin line step having a width that is less than a width of the bandwidth compensation trace.

6. The low band dipole of claim 1, wherein each resonator block structure has a plurality of gaps that define an inner portion and an outer portion, wherein two adjacent gaps are separated by a bridge portion.

7. The low band dipole of claim 6, wherein each resonator block structure comprises a decoupling structure.

8. The low band dipole of claim 7, wherein the decoupling structure comprises:

a gap formed in the outer portion of the resonator block structure; and a tab protrusion disposed in the gap formed in the outer portion of the resonator block structure, wherein the tab protrusion is continuous with the inner portion of the resonator block structure.

9. The low band dipole of claim 1, wherein the coupling plate is capacitively coupled to the conductive trace pattern.

10. A low band dipole for a multiband antenna, comprising:

a balun stem, and a plurality of dipole arms mechanically coupled to the dipole stem, wherein each of the dipole arms comprises:

a plurality of resonator means;

a coupling plate that is directly coupled to a balun trace disposed on the balun stem;

a means for phase shifting disposed between adjacent resonator means; and a means for bandwidth compensation disposed between the adjacent resonator means.

* * * * *